(12) United States Patent
Wang

(10) Patent No.: US 10,803,799 B2
(45) Date of Patent: Oct. 13, 2020

(54) PIXEL CIRCUIT AND METHOD OF DRIVING THE SAME, DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Zheng Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/150,630

(22) Filed: Oct. 3, 2018

(65) Prior Publication Data

US 2019/0180681 A1   Jun. 13, 2019

(30) Foreign Application Priority Data

Dec. 8, 2017   (CN) .......................... 2017 1 1306005

(51) Int. Cl.
| | |
|---|---|
| *G09G 3/3233* | (2016.01) |
| *H01L 27/32* | (2006.01) |
| *G09G 3/3266* | (2016.01) |
| *G09G 3/3291* | (2016.01) |

(52) U.S. Cl.
CPC .......... *G09G 3/3233* (2013.01); *G09G 3/3266* (2013.01); *G09G 3/3291* (2013.01); *H01L 27/3276* (2013.01); *G09G 2300/0426* (2013.01); *G09G 2300/0814* (2013.01); *G09G 2300/0819* (2013.01); *G09G 2310/08* (2013.01); *G09G 2320/0233* (2013.01); *G09G 2320/045* (2013.01)

(58) Field of Classification Search
CPC .. G09G 3/3233; G09G 3/3266; G09G 3/3291; G09G 3/32; H01L 27/3276
See application file for complete search history.

(56) References Cited

U.S. PATENT DOCUMENTS

| | | | |
|---|---|---|---|
| 2008/0259064 | A1 | 10/2008 | Chiou |
| 2016/0372030 | A1* | 12/2016 | Nagayama ............... G09G 3/32 |

FOREIGN PATENT DOCUMENTS

| | | |
|---|---|---|
| CN | 103000133 A | 3/2013 |
| CN | 103150991 A | 6/2013 |
| CN | 104409051 A | 3/2015 |

(Continued)

OTHER PUBLICATIONS

First Office Action for CN Application No. 201711306005.7 dated Apr. 28, 2019.

*Primary Examiner* — Alexander Eisen
*Assistant Examiner* — Cory A Almeida
(74) *Attorney, Agent, or Firm* — Dinsmore & Shohl LLP

(57) ABSTRACT

The present disclosure relate to a pixel circuit, a method of driving the pixel circuit and a display device. A pixel circuit, including: a light-emitting element configured to emit light; an input sub-circuit configured to receive a data signal under the control of a scan signal; a storage sub-circuit configured to store the data signal; a node control sub-circuit configured to receive a clock signal; and a driving sub-circuit configured to drive the light-emitting element to emit light based on the clock signal from the node control sub-circuit and the data signal stored in the storage sub-circuit.

16 Claims, 14 Drawing Sheets

(56) References Cited

FOREIGN PATENT DOCUMENTS

| | | | |
|---|---|---|---|
| CN | 104464642 | A | 3/2015 |
| CN | 105789250 | A | 7/2016 |
| CN | 207474027 | U | 6/2018 |

* cited by examiner

PIXEL CIRCUIT AND METHOD OF DRIVING THE SAME, DISPLAY DEVICE

CROSS REFERENCE TO RELATED APPLICATIONS

The present application claims priority to Chinese Patent Application No. 201711306005.7 filed on Dec. 8, 2017, the disclosure of which is hereby incorporated by reference in its entirety.

FIELD

Embodiments of the present disclosure relate to the field of display technologies, and in particular, to a pixel circuit, a method of driving the pixel circuit, and a display device.

BACKGROUND

Organic Light-Emitting Diode (OLED) is one of the hotspots in current flat panel display researches. Compared with Liquid Crystal Display (LCD), OLED has advantages such as low energy consumption, low production cost, self-luminescence, wide viewing angle, and fast response speed, etc. OLED displays have begun to replace traditional LCD displays in display fields, such as in mobile phones, tablet computers and digital cameras, etc.

Different from LCDs that use a stable voltage to control brightness, OLEDs are current-driven devices and require a constant current to control light emitting of the devices. A typical OLED display outputs a current to an OLED through a driving transistor in a pixel circuit of each pixel to drive the OLED to emit light.

SUMMARY

In one aspect of the present disclosure, there is provided a pixel circuit, including: a light-emitting element configured to emit light; an input sub-circuit configured to receive a data signal under the control of a scan signal; a storage sub-circuit configured to store the data signal; a node control sub-circuit configured to receive a clock signal; and a driving sub-circuit configured to drive the light-emitting element to emit light based on the clock signal from the node control sub-circuit and the data signal stored in the storage sub-circuit.

According to some embodiments of the present disclosure, the input sub-circuit may be connected to a data signal terminal for providing the data signal, a scan signal terminal for providing the scan signal, and a first node, the storage sub-circuit may be connected to the first node and a second node, the node control sub-circuit may be connected to a clock signal terminal for providing the clock signal and the second node, and may control a voltage of the second node according to the clock signal of the clock signal terminal, the driving sub-circuit may be connected to the second node, a third node, and a first power terminal for providing a first voltage and a second voltage, and a first electrode of the light-emitting element may be connected to the third node, and a second electrode of the light-emitting element is connected to a second power terminal.

According to some embodiments of the present disclosure, the pixel circuit may further include a compensation sub-circuit, wherein the compensation sub-circuit may be connected to a first control terminal for controlling the compensation sub-circuit, the second node and the third node, and may be configured to provide a voltage of the third node to the second node under the control of the first control terminal.

According to some embodiments of the present disclosure, the pixel circuit may further include a switch control sub-circuit, wherein the switch control sub-circuit may be connected to a second control terminal for controlling the switch control sub-circuit, the third node and the light emitting element, and may be configured to control the conduction between the third node and the first electrode of the light-emitting element under the control of the second control terminal.

According to some embodiments of the present disclosure, the input sub-circuit may include a first switching transistor, and a control electrode of the first switching transistor may be connected to the scan signal terminal, a first electrode of the first switching transistor may be connected to the data signal terminal, and a second electrode of the first switching transistor may be connected to the first node.

According to some embodiments of the present disclosure, the storage sub-circuit may include a first capacitor, a first terminal of the first capacitor may be connected to the first node, and a second terminal of the first capacitor may be connected to the second node.

According to some embodiments of the present disclosure, the node control sub-circuit may include a second capacitor, a first terminal of the second capacitor may be connected to the clock signal terminal, and a second terminal of the second capacitor may be connected to the second node.

According to some embodiments of the present disclosure, the driving sub-circuit may include a driving transistor, a control electrode of the driving transistor may be connected to the second node, a first electrode of the driving transistor may be connected to the first power terminal, and a second electrode of the driving transistor may be connected to the third node.

According to some embodiments of the present disclosure, the compensation sub-circuit may include a second switching transistor, a control electrode of the second switching transistor may be connected to the first control terminal, a first electrode of the second switching transistor may be connected to the second node, and a second electrode of the second switching transistor may be connected to the third node.

According to some embodiments of the present disclosure, the switch control sub-circuit may include a third switching transistor, a control electrode of the third switching transistor may be connected to the second control terminal, a first electrode of the third switching transistor may be connected to the third node, and a second electrode of the third switching transistor may be connected to the first electrode of the light-emitting element.

According to some embodiments of the present disclosure, the pixel circuit may further include a compensation sub-circuit and a switch control sub-circuit, wherein the input sub-circuit may include a first switching transistor, the storage sub-circuit may include a first capacitor, the driving sub-circuit may include a driving transistor, the node control sub-circuit may include a second capacitor, the compensation sub-circuit may include a second switching transistor, the switch control sub-circuit may include a third switching transistor, a control electrode of the first switching transistor may be connected to the scan signal terminal, a first electrode of the first switching transistor may be connected to the data signal terminal, and a second electrode of the first switching transistor may be connected to a first terminal of the first capacitor, a control electrode of the second switching transistor may be connected to the first control terminal, a first electrode of the second switching transistor may be connected to a second terminal of the first capacitor, and a second electrode of the second switching transistor may be connected to a first electrode of the third switching transistor, a control electrode of the third switching transistor may be connected to the second control terminal, a second electrode of the third switching transistor may be connected to a first electrode of the light-emitting element, a control electrode of the driving transistor may be connected to the second terminal of the first capacitor, a first electrode of the driving transistor may be connected to a first power terminal, and a second electrode of the driving transistor may be connected to the first electrode of the third switching transistor, and a first terminal of the second capacitor may be connected to the clock signal terminal, and a second terminal of the second capacitor may be connected to the second terminal of the first capacitor.

In another aspect of the present disclosure, there is provided a display device, including the pixel circuit according to the present disclosure.

In a still further aspect of the present disclosure, there is provided a method of driving the pixel circuit according to the present disclosure, including: in a writing stage, writing the data signal to the storage sub-circuit under the control of the scan signal; and in a light-emitting stage, under the control of the clock signal, driving, by the driving sub-circuit, the light-emitting element to emit light according to the data signal in the storage sub-circuit.

According to some embodiments of the present disclosure, the input sub-circuit may be connected to a data signal terminal, a scan signal terminal, and a first node, the storage sub-circuit may be connected to a first node and a second node, the node control sub-circuit may be connected to a clock signal terminal and the second node, and may control a voltage of the second node according to a signal of the clock signal terminal, the driving sub-circuit may be connected to the second node, a third node, and a first power terminal, a first electrode of the light-emitting element may be connected to the third node, and a second electrode of the light-emitting element may be connected to a second power terminal, and the driving sub-circuit may include a driving transistor, and in the light emitting stage, under the control of the clock signal, the voltage of the second node may be greater than a sum of a first voltage of the first power terminal and a threshold voltage of the driving transistor, or less than the first voltage of the first power terminal, and the driving transistor may be controlled to be turned on or off according to the voltage of the second node.

According to some embodiments of the present disclosure, under the control of the clock signal, the voltage of the second node being greater than a sum of a first voltage of the first power terminal and a threshold voltage of the driving transistor, or less than the first voltage of the first power terminal may include: when the signal of the clock signal terminal is at a high level, the voltage of the second node may be greater than the sum of the first voltage of the first power terminal and the threshold voltage of the driving transistor; and when the signal of the clock signal terminal is at a low level, the voltage of the second node may be less than the first voltage of the first power terminal; the driving transistor being controlled to be turned on or off according to the voltage of the second node includes: when the voltage of the second node is greater than the sum of the first voltage of the first power terminal and the threshold voltage of the driving sub-circuit, the driving transistor may output a driving current; and when the voltage of the second node is less than the first voltage of the first power terminal, the driving transistor may be set in a reverse biased state.

According to some embodiments of the present disclosure, the method may further include: in a compensation stage, under the control of a signal of a first control terminal, writing the sum of the threshold voltage of the driving transistor and a second voltage supplied by the first power terminal to a second terminal of the storage sub-circuit.

According to some embodiments of the present disclosure, the method further include: in the light emitting stage, under the control of a signal of the second control terminal, conductively connecting a second electrode of the driving transistor to the first electrode of the light emitting element.

Other features and advantages of the present disclosure will be presented in the following description, and partly become apparent in the following description or be appreciated in practicing of the present disclosure. The objectives and other advantages of the embodiments of the present disclosure can be realized and obtained by the structure particularly pointed out in the description, claims and accompanying drawings. Certainly, any of the products or methods implementing the present disclosure does not necessarily achieve all the above advantages at the same time.

DESCRIPTION OF THE DRAWINGS

The accompanying drawings are included to provide a further understanding of the technical solution of the present application and are incorporated in and constitute a part of this specification, and together with the illustrative embodiments of the present application serve to explain the technical solution of the present application, but are not limitation thereof.

DETAILED DESCRIPTIONS

Figure 1:
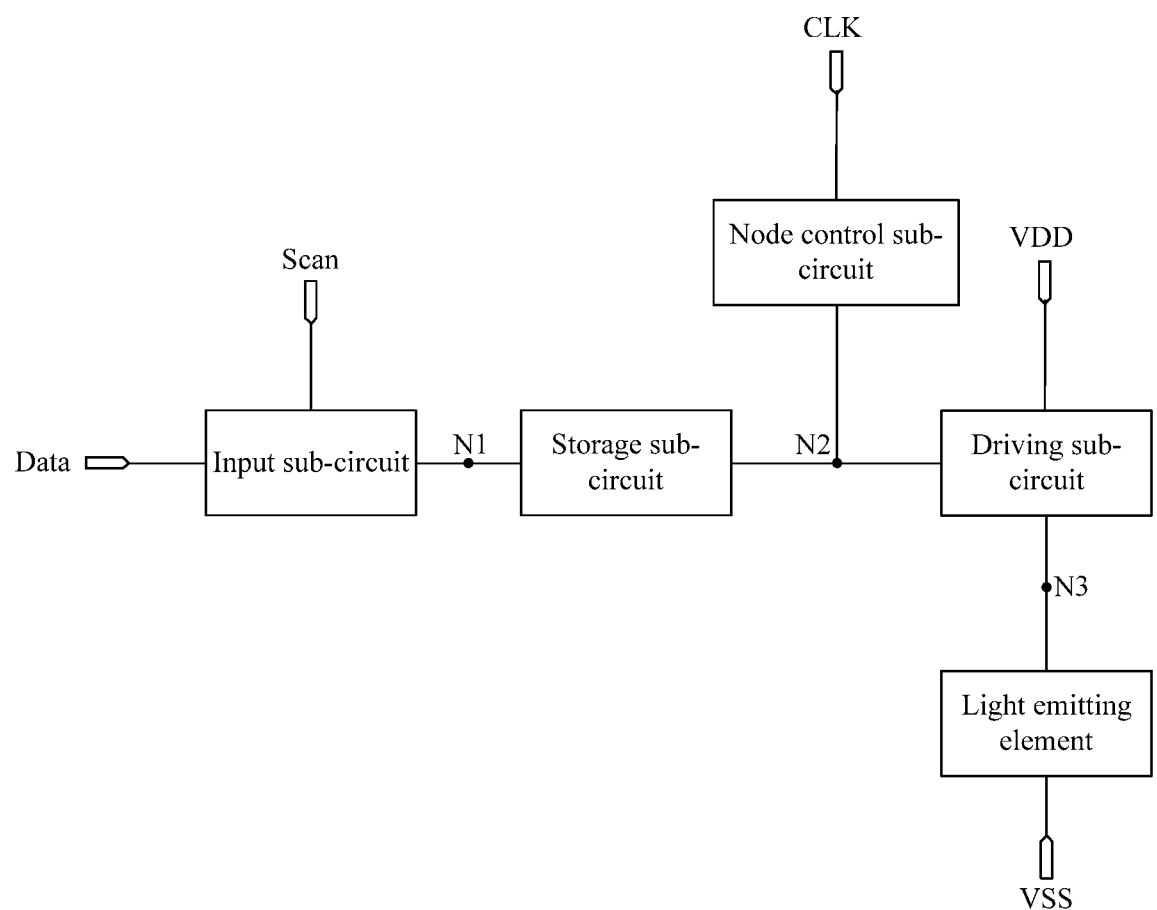
FIG. 1 is a schematic structural diagram of a pixel circuit according to an embodiment of the present disclosure.

To a clear understanding of the object of the present disclosure, its technical solution and advantages, the present disclosure will be further described in detail below in conjunction with the accompanying drawings and embodiments. It should be noted that, in the case of no conflict, the embodiments and the features of the embodiments of the present disclosure may be combined with each other.

Unless defined otherwise, all technical and scientific terms used in the present disclosure have the same meaning as commonly understood by one of ordinary skill in the art to which the embodiments of the present disclosure belong. The use of the terms "first", "second" or the like in the present disclosure does not denote any order, quantity or importance, but are merely used to distinguish between different components. The terms "comprise", "include" and the like mean that the elements or objects preceding the term cover the elements or objects listed after the term and their equivalents, without excluding other elements or objects. The terms "connect", "connecting" and the like are not limited to physical or mechanical connections, but may include electrical connections, regardless of whether the connections are direct or indirect connections. The terms "up", "down", "left", "right" and the like are used only to represent a relative positional relationship, and the relative positional relationship may be changed if the absolute position of the described object changes.

Those skilled in the art can understand that the switching transistor and the driving transistor used in all embodiments of the present application may be thin film transistors or field effect transistors or other devices having the same characteristics. Preferably, the thin film transistor used in the embodiment of the present disclosure may be an oxide semiconductor transistor. Since the source electrode and drain electrode of the switching transistor used here are in a symmetrical relation, the source electrode and the drain electrode can be interchanged. In the embodiments of the present disclosure, the control electrode is a gate electrode. To distinguish the other two electrodes than the gate electrode of the switching transistor, one of the electrodes is referred to as a first electrode, the other electrode is referred to as a second electrode, and the first electrode may be a source electrode or a drain electrode, the second electrode may be a drain electrode or a source electrode.

According to the research by the inventor, when the driving transistor in an existing pixel circuit drives the OLED to emit light for displaying, the driving transistor is in a forward bias state. The driving transistor captures electrons when the gate-source voltage difference of the driving transistor is large, causing not only an increase in the threshold voltage of the driving transistor and a decrease of its service life, but also a decrease in the current flowing through the OLED and lowered brightness and service time of the OLED.

In order to solve the technical problem of electrical parameter drift and decrease in current efficiency of the drive transistor and a lowered brightness and service life of OLED, the embodiments of the present disclosure provide a pixel circuit, a method of driving the pixel circuit, and a display device.

FIG. 1 is a schematic structural diagram of a pixel circuit according to an embodiment of the present disclosure. As shown in FIG. 1, a pixel circuit provided in an embodiment of the present disclosure includes: an input sub-circuit, a storage sub-circuit, a node control sub-circuit, a driving sub-circuit and a light-emitting element.

Specifically, in an embodiment according to the present disclosure, the input sub-circuit is connected to a data signal terminal Data, a scan signal terminal Scan, and a first node N1, and configured to provide a signal of the data signal terminal Data to the first node N1 under the control of the scan signal terminal Scan.

The storage sub-circuit is connected to the first node N1 and the second node N2, and configured to maintain a voltage difference between the first node N1 and the second node N2.

The node control sub-circuit is connected to a clock signal terminal CLK and the second node N2, and configured to control the voltage of the second node N2 under the control of the clock signal terminal CLK.

Specifically, the node control sub-circuit is configured to pull up the voltage of the second node N2 when the signal of the clock signal terminal CLK is at a high level; and pull down the voltage of the second node N2 when the signal of the clock signal terminal CLK is at a low level.

The driving sub-circuit is connected to the second node N2, the third node N3, and the first power terminal VDD, and configured to output a driving current or be reversely biased (turned off) under the control of the second node N2 and the first power terminal VDD.

A first electrode of the light-emitting element is connected to a third node N3, and the second electrode of the light-emitting element is connected to a second power terminal VSS.

Alternatively, the light-emitting element may be an organic light emitting diode OLED, the first electrode is the anode and the second electrode is the cathode.

It should be noted that the voltage of the second power terminal VSS is steadily held at a low level, and the scan signal terminal Scan is, for example, a scan line, and the data signal terminal Data is, for example, a data line.

The pixel circuit provided by an embodiment of the present disclosure includes: a light-emitting element for emitting light; an input sub-circuit for receiving a data signal under the control of a scan signal; a storage sub-circuit for storing the data signal; a node control sub-circuit for receiving a clock signal; and a driving sub-circuit for driving the light-emitting element to emit light based on the clock signal from the node control sub-circuit and the data signal stored in the storage sub-circuit. In the technical solution provided by the embodiment of the present disclosure, through providing the storage sub-circuit and the node control sub-circuit, electrical parameter drift in the driving transistor can be reduced, the current efficiency can be restored, and the brightness and service life of the organic light-emitting diode can be improved.

Figure 2:
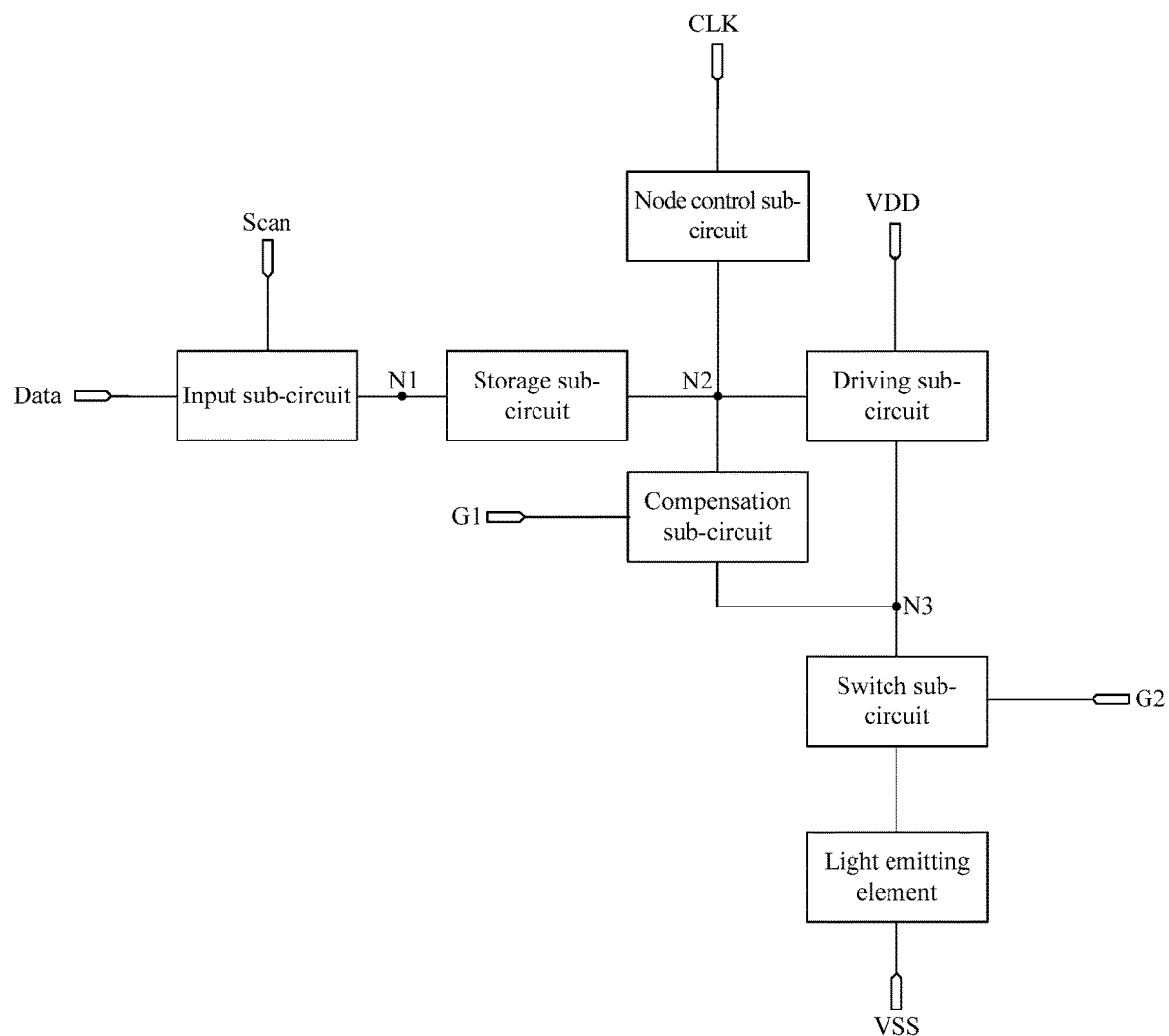
FIG. 2 is another schematic structural diagram of the pixel circuit according to an embodiment of the present disclosure.

Optionally, FIG. 2 is another schematic structural diagram of a pixel circuit according to an embodiment of the present disclosure. As shown in FIG. 2, the pixel circuit provided by the embodiment of the present disclosure further includes: a compensation sub-circuit.

The compensation sub-circuit is connected to a first control terminal G1, the second node N2 and the third node N3, and is configured to provide a voltage of the third node N3 to the second node N2 under the control of the first control terminal G1.

Specifically, the compensation sub-circuit is further configured to disconnect the second node N2 from the third node N3 under the control of the first control terminal G1.

Optionally, the pixel circuit provided by the embodiment of the present disclosure further includes: a switch control sub-circuit.

The switch control sub-circuit is connected to the second control terminal G2, the third node N3 and the light-emitting element, and is configured to control the conduction between the third node N3 and the first electrode of the light-emitting element under the control of the second control terminal G2.

Specifically, the switch control sub-circuit is further configured to control disconnection between the third node N3 and the first electrode of the light-emitting element under the control of the second control terminal G2.

Figure 3:
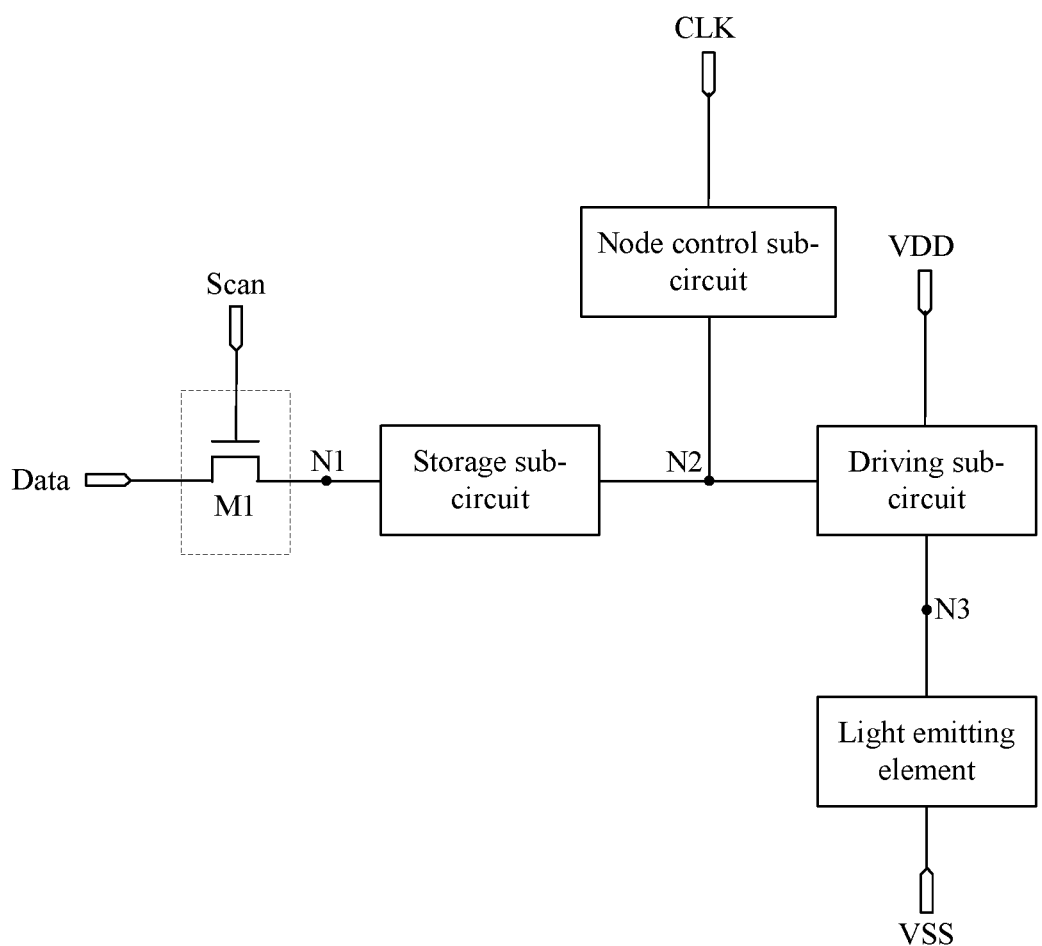
FIG. 3 is a schematic structural diagram of an input sub-circuit according to an embodiment of the present disclosure.

FIG. 3 is a schematic structural diagram of an input sub-circuit according to an embodiment of the present disclosure. As shown in FIG. 3, the input sub-circuit includes: a first switching transistor M1; a control electrode of the first switching transistor M1 is connected to the scan signal terminal Scan, a first electrode of the first switching transistor M1 is connected to the data signal terminal Data, and a second electrode of the first switching transistor M1 is connected to the first node N1.

It should be noted that FIG. 3 specifically illustrates an exemplary structure of the input sub-circuit. It should be understood by those skilled in the art that the implementation of this input sub-circuit is not limited thereto, as long as the function can be realized.

Figure 4:
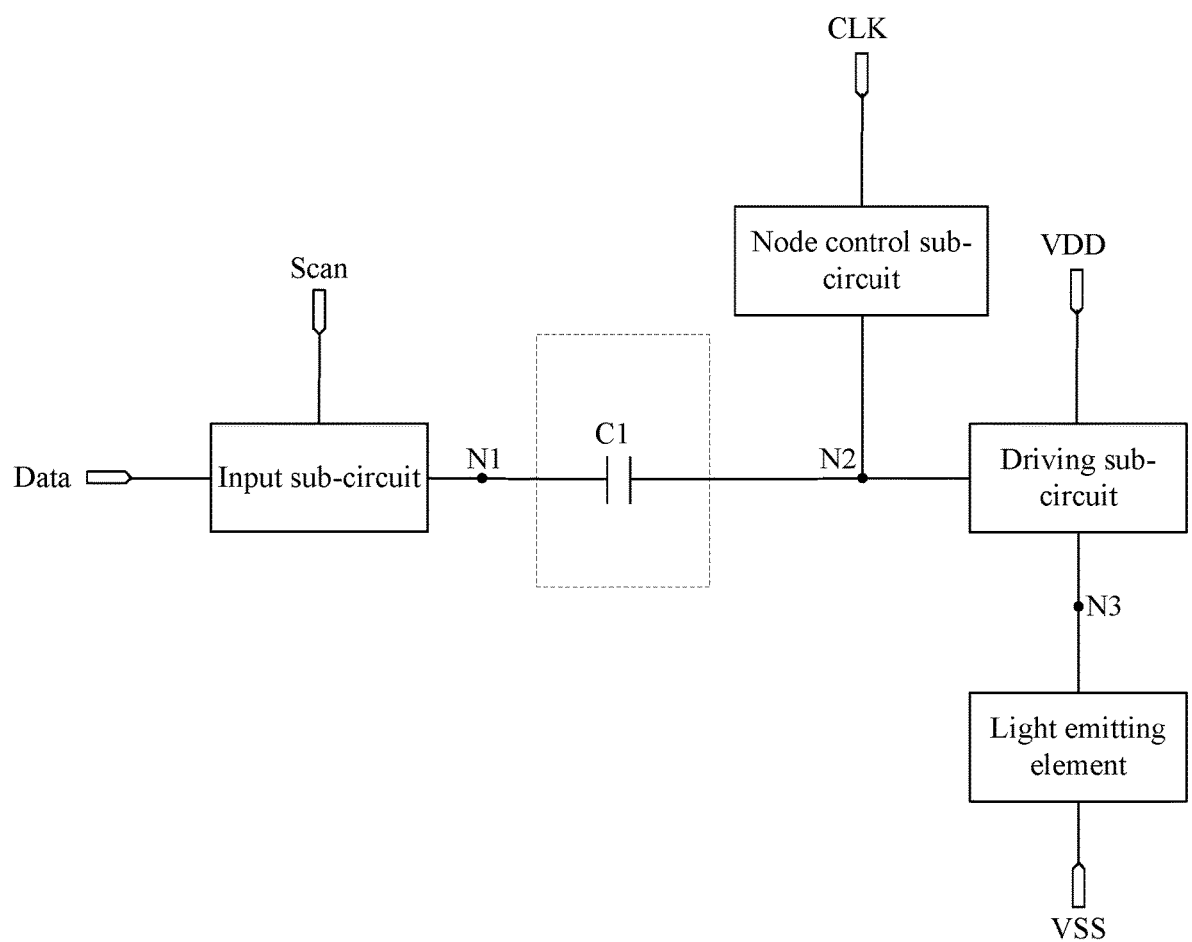
FIG. 4 is a schematic structural diagram of a storage sub-circuit according to an embodiment of the present disclosure.

FIG. 4 is a schematic structural diagram of a storage sub-circuit according to an embodiment of the present disclosure. As shown in FIG. 4, the storage sub-circuit includes: a first capacitor C1. A first terminal of the first capacitor C1 is connected to the first node N1, and a second terminal of the first capacitor C1 is connected to the second node N2.

It should be noted that FIG. 4 specifically illustrates an exemplary structure of the storage sub-circuit. It should be understood by those skilled in the art that the implementation of this storage sub-circuit is not limited thereto, as long as the function can be realized.

Figure 5:
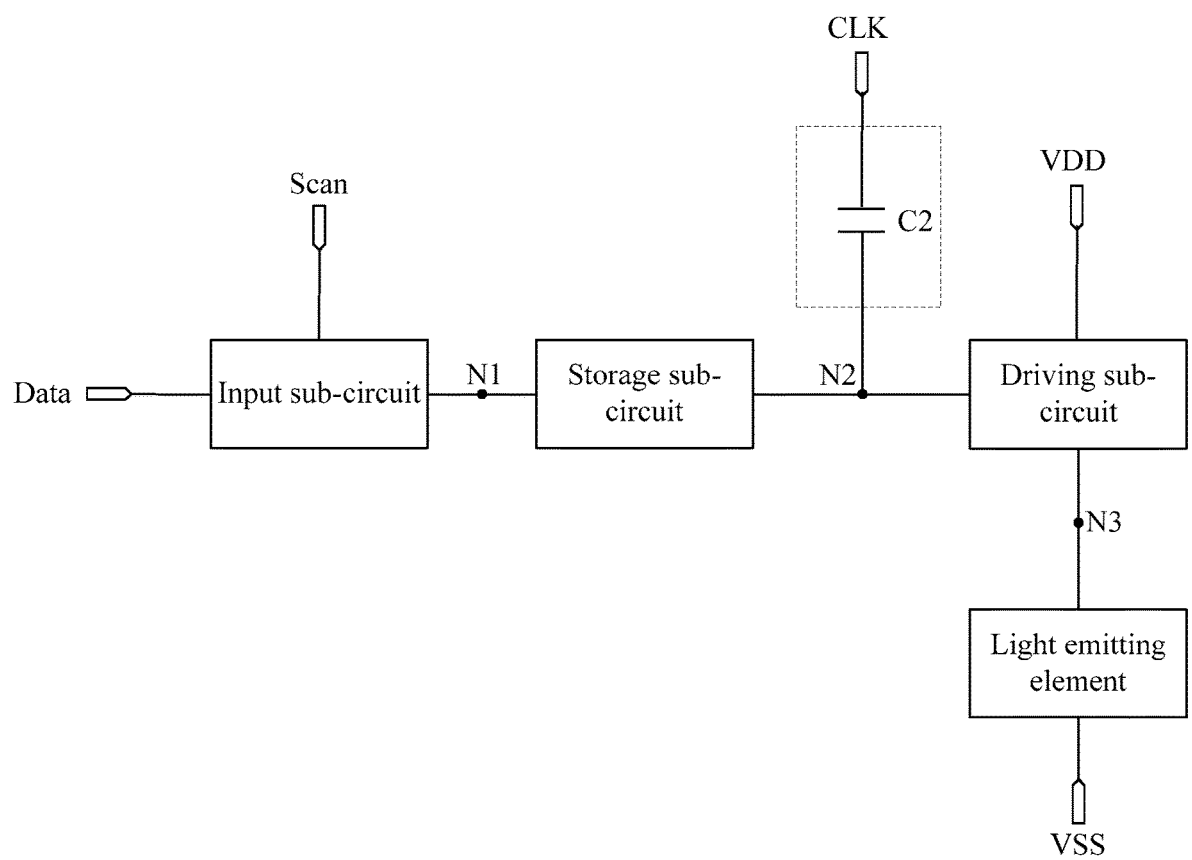
FIG. 5 is a schematic structural diagram of a node control sub-circuit according to an embodiment of the present disclosure.

FIG. 5 is a schematic structural diagram of a node control sub-circuit according to an embodiment of the present disclosure. As shown in FIG. 5, the node control sub-circuit includes: a second capacitor C2. One terminal of the second capacitor C2 is connected to the clock signal terminal CLK, and the other terminal of the second capacitor C2 is connected to the second node N2.

It should be noted that FIG. 5 specifically illustrates an exemplary structure of the node control sub-circuit. It should be understood by those skilled in the art that the implementation of this sub-circuit is not limited thereto, as long as the function can be realized.

Figure 6:
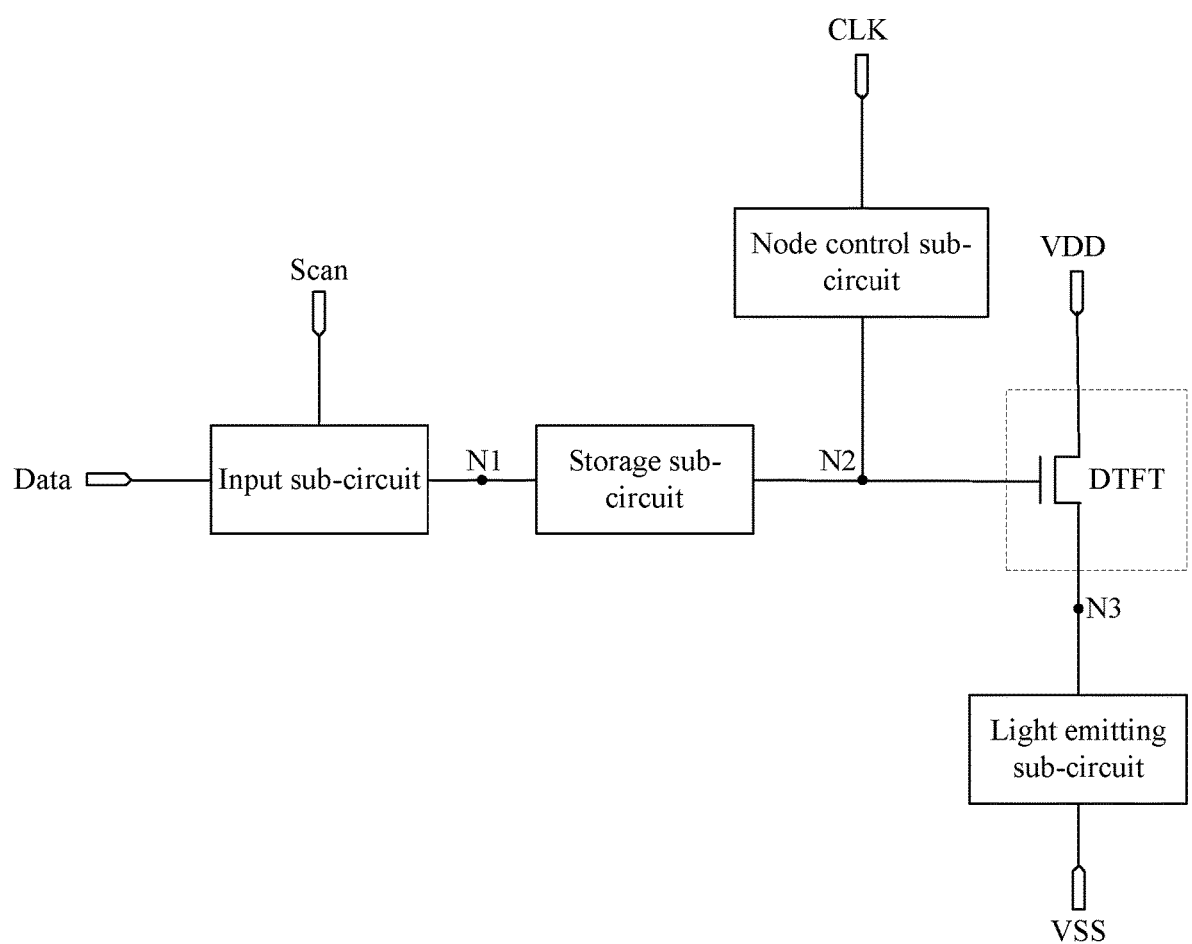
FIG. 6 is a schematic structural diagram of a driving sub-circuit according to an embodiment of the present disclosure.

FIG. 6 is a schematic structural diagram of a driving sub-circuit according to an embodiment of the present disclosure. As shown in FIG. 6, the driving sub-circuit includes: a driving transistor DTFT. A control electrode of the driving transistor DTFT is connected to the second node N2, a first electrode of the driving transistor DTFT is connected to the first power terminal VDD, and a second electrode of the driving transistor DTFT is connected to the third node N3.

It should be noted that FIG. 6 specifically illustrates an exemplary structure of the driving sub-circuit. It should be understood by those skilled in the art that the implementation of this sub-circuit is not limited thereto, as long as the function can be realized.

Figure 7:
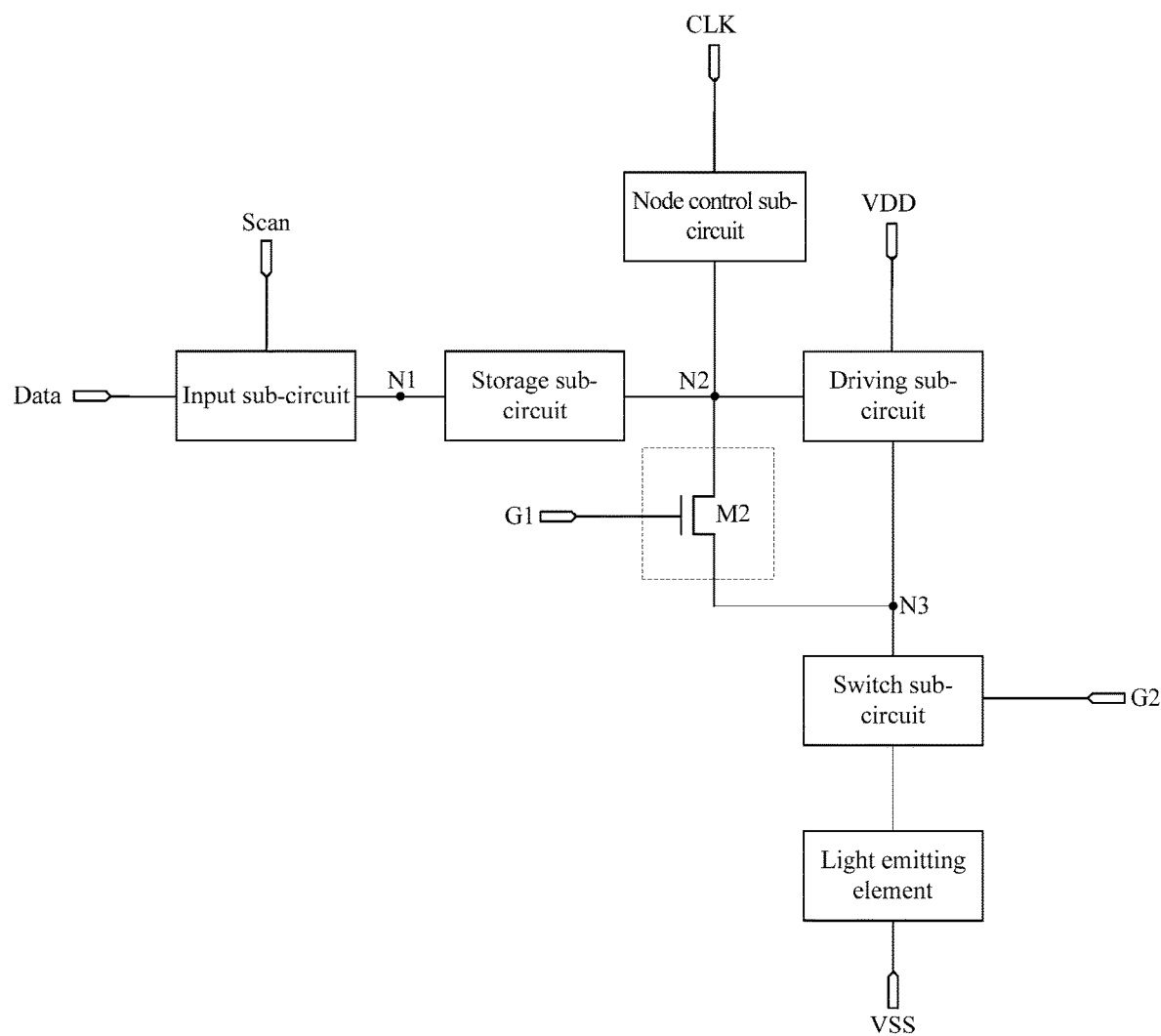
FIG. 7 is a schematic structural diagram of a compensation sub-circuit according to an embodiment of the present disclosure.

FIG. 7 is a schematic structural diagram of a compensation sub-circuit according to an embodiment of the present disclosure. As shown in FIG. 7, the compensation sub-circuit includes: a second switching transistor M2. A control electrode of the second switching transistor M2 is connected to the first control terminal G1, a first electrode of the second switching transistor M2 is connected to the second node N2, and a second electrode of the second switching transistor M2 is connected to the third node N3.

It should be noted that FIG. 7 specifically illustrates an exemplary structure of the compensation sub-circuit. It should be understood by those skilled in the art that the implementation of this sub-circuit is not limited thereto, as long as the function can be realized.

Figure 8:
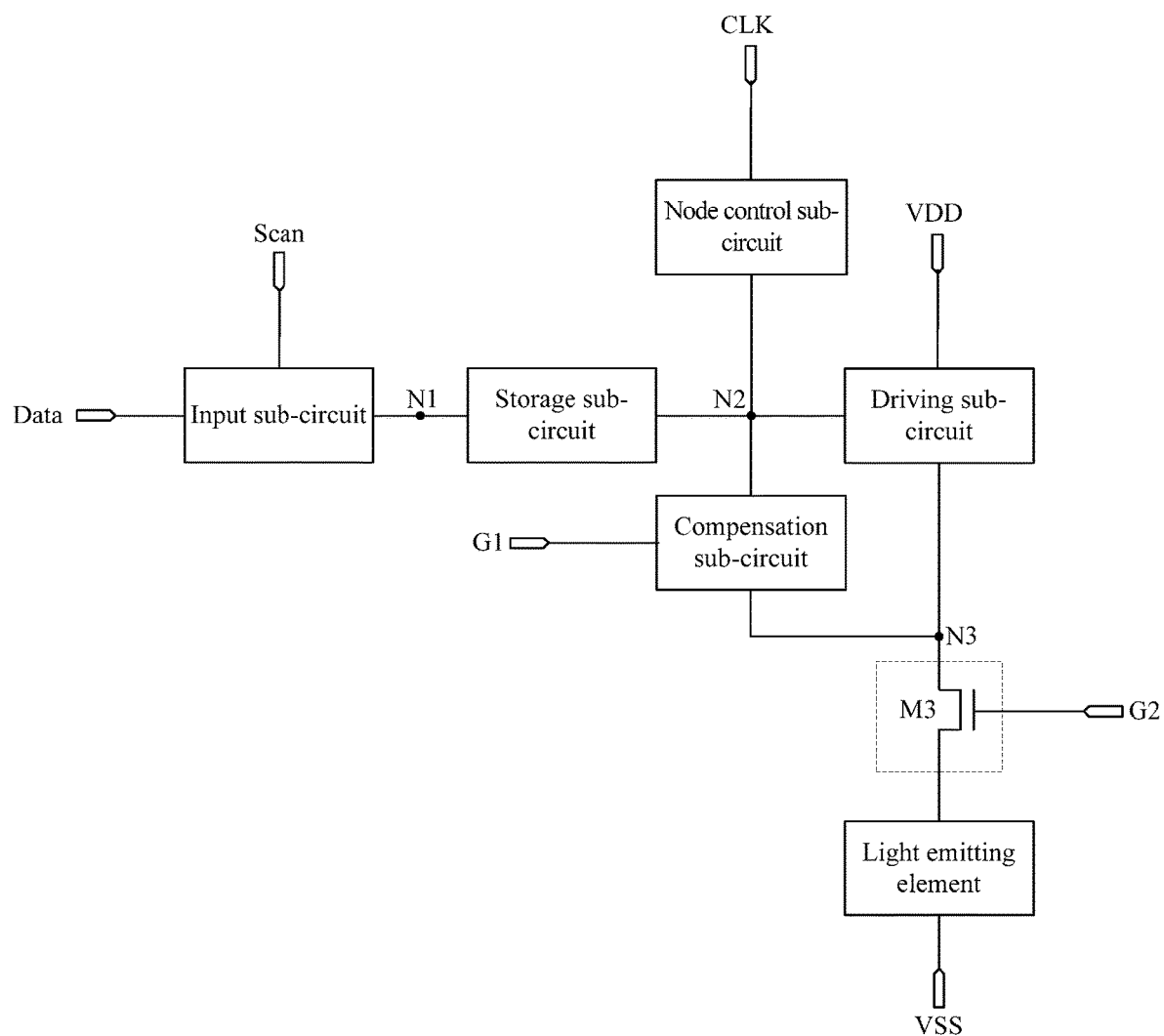
FIG. 8 is a schematic structural diagram of a switch control sub-circuit according to an embodiment of the present disclosure.

FIG. 8 is a schematic structural diagram of a switch control sub-circuit according to an embodiment of the present disclosure. As shown in FIG. 8, the switch control sub-circuit includes: a third switching transistor M3. A control electrode of the third switching transistor M3 is connected to the second control terminal G2, a first electrode of the third switching transistor M3 is connected to the third node N3, and a second electrode of the third switching transistor M3 is connected to the first electrode of the light-emitting element.

It should be noted that FIG. 8 specifically illustrates an exemplary structure of the switch control sub-circuit. It should be understood by those skilled in the art that the implementation of this sub-circuit is not limited thereto, as long as the function can be realized.

Figure 9:
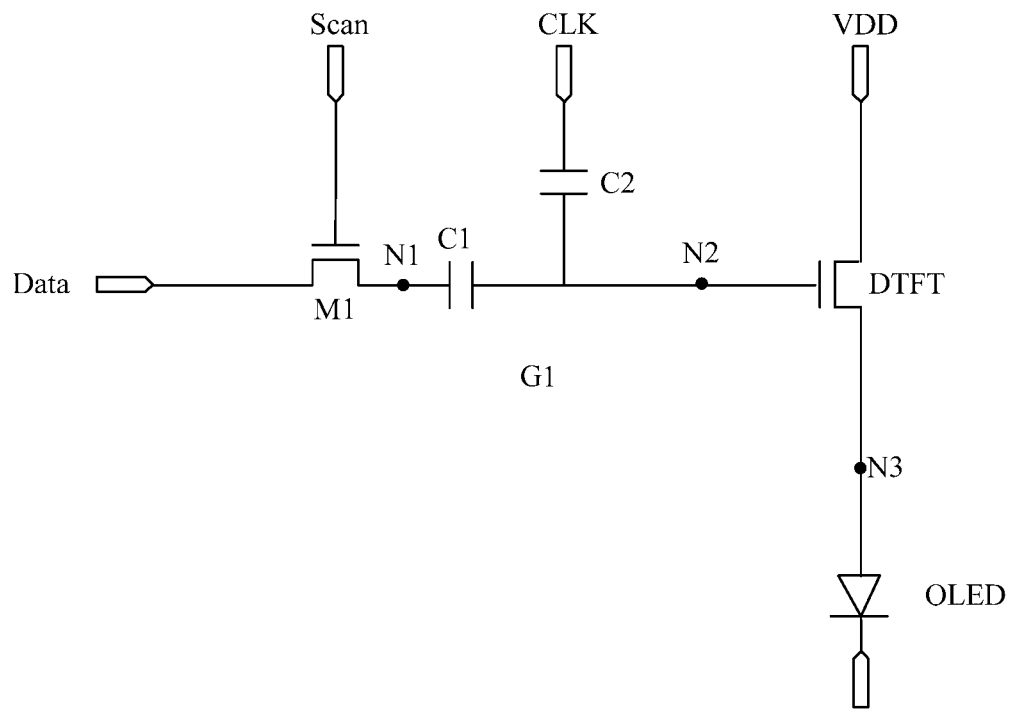
FIG. 9 is an equivalent circuit diagram of a pixel circuit according to an embodiment of the present disclosure.

FIG. 9 is an equivalent circuit diagram of a pixel circuit according to an embodiment of the present disclosure. As shown in FIG. 9, the pixel circuit includes: an input sub-circuit, a storage sub-circuit, a driving sub-circuit, and a node control sub-circuit. The input sub-circuit includes: a first switching transistor M1. The storage sub-circuit includes: a first capacitor C1. The driving sub-circuit includes: a driving transistor DTFT. The node control sub-circuit includes: a second capacitor C2.

Specifically, a control electrode of the first switching transistor M1 is connected to the scan signal terminal Scan, a first electrode of the first switching transistor M1 is connected to the data signal terminal Data, and the second electrode of the first switching transistor M1 is connected to a first terminal of the first capacitor C1. A control electrode of the driving transistor DTFT is connected to a second terminal of the capacitor C1, a first electrode of the driving transistor DTFT is connected to a first power terminal VDD, and a second electrode of the driving transistor DTFT is connected to the first electrode of the organic light emitting diode OLED. A first terminal of the second capacitor C2 is connected to the clock signal terminal CLK, and a second terminal of the second capacitor C2 is connected to the second terminal of the first capacitor C1.

Figure 10:
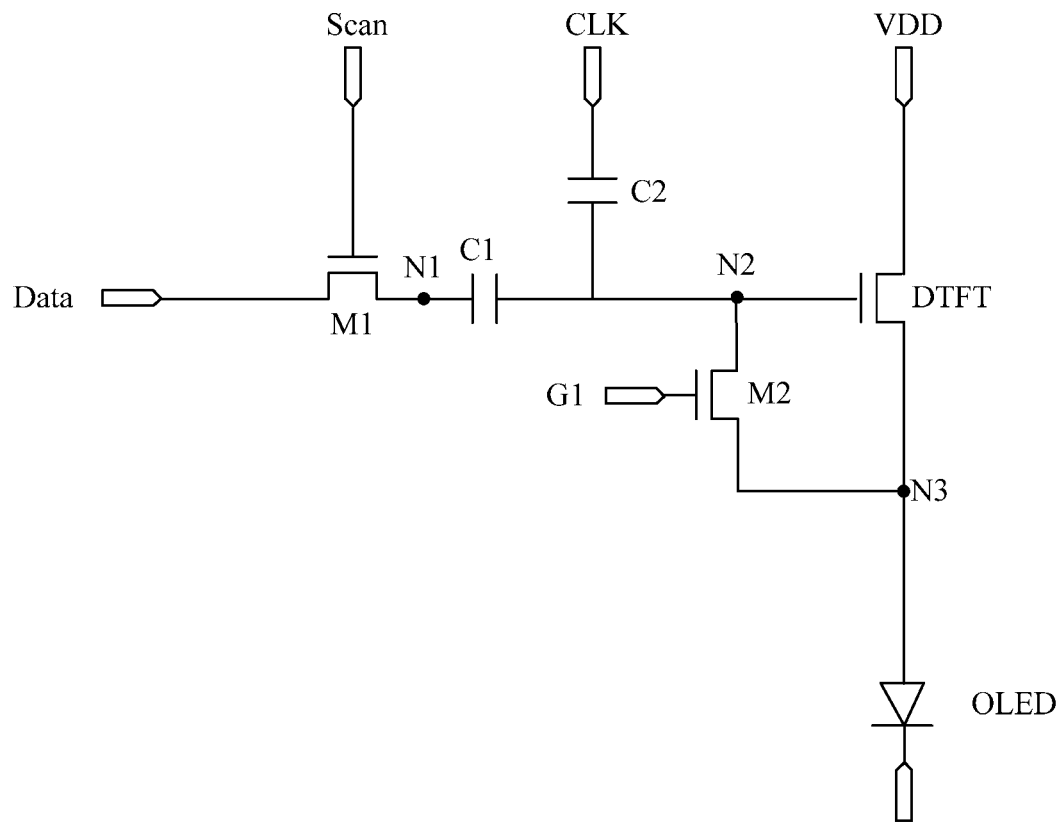
FIG. 10 is another equivalent circuit diagram of a pixel circuit according to an embodiment of the present disclosure.

FIG. 10 is another equivalent circuit diagram of a pixel circuit according to an embodiment of the present disclosure. As shown in FIG. 10, the pixel circuit includes: an input sub-circuit, a storage sub-circuit, a driving sub-circuit, a node control sub-circuit, and a compensation sub-circuit. The input sub-circuit includes: a first switching transistor M1. The storage sub-circuit includes: a first capacitor C1. The driving sub-circuit includes: a driving transistor DTFT. The node control sub-circuit includes: a second capacitor C2. The compensation sub-circuit includes: a second switching transistor M2.

Specifically, a control electrode of the first switching transistor M1 is connected to the scan signal terminal Scan, a first electrode of the first switching transistor M1 is connected to the data signal terminal Data, a second electrode of the first switching transistor M1 is connected to a first terminal of the first capacitor C1. A control electrode of the second switching transistor M2 is connected to a first control electrode G1, a first electrode of the second switching transistor M2 is connected to a second terminal of the first capacitor C1, a second electrode of the second switching transistor M2 is connected to a first electrode of the organic light-emitting diode OLED. A control electrode of the driving transistor DTFT is connected to the second terminal of the first capacitor C1, a first electrode of the driving transistor DTFT is connected to a first power terminal VDD, a second electrode of the driving transistor DTFT is connected to the first electrode of the organic light-emitting diode OLED. A first terminal of the second capacitor C2 is connected to the clock signal terminal CLK, and a second terminal of the second capacitor C2 is connected to the second terminal of the first capacitor C1.

Figure 11:
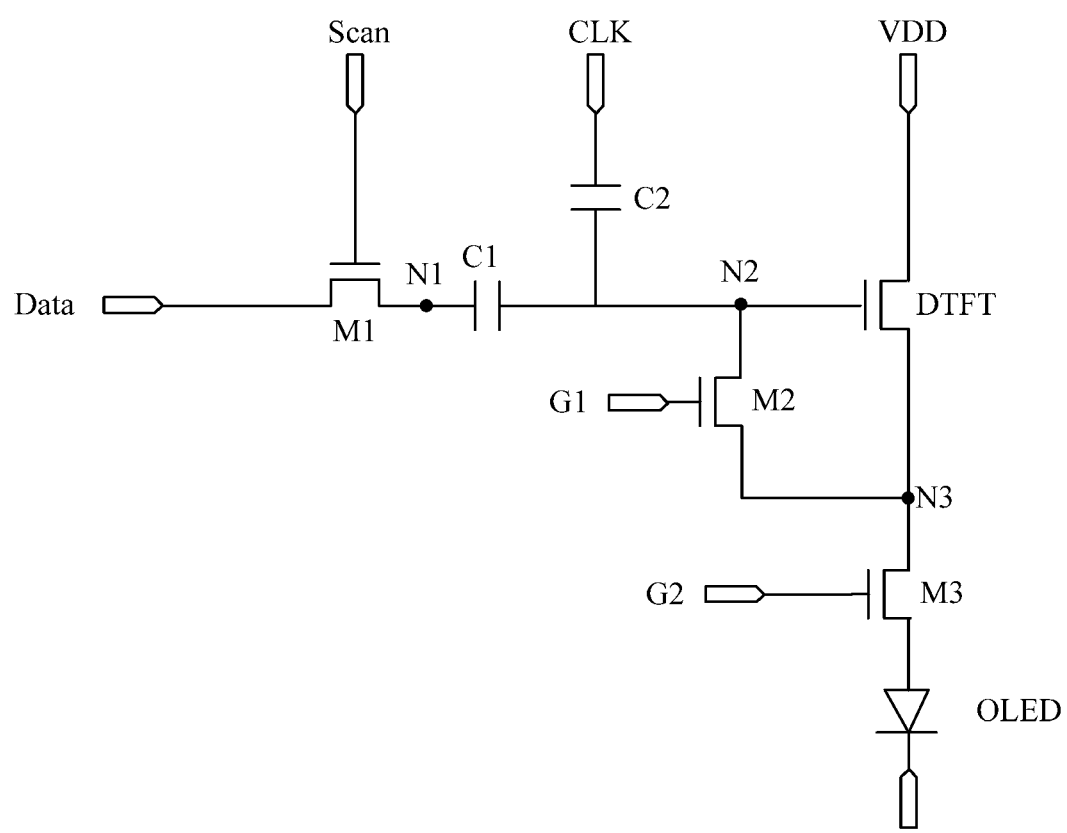
FIG. 11 is still another equivalent circuit diagram of a pixel circuit according to an embodiment of the present disclosure.

FIG. 11 is still another equivalent circuit diagram of a pixel circuit according to an embodiment of the present disclosure. As shown in FIG. 11, the pixel circuit includes: an input sub-circuit, a storage sub-circuit, a driving sub-circuit, a node control sub-circuit, a compensation sub-circuit, and a switch control sub-circuit. The input sub-circuit includes: a first switching transistor M1. The storage sub-circuit includes: a first capacitor C1. The driving sub-circuit includes: a driving transistor DTFT. The node control sub-circuit includes: a second capacitor C2. The compensation sub-circuit includes: a second switching transistor M2. The switch control sub-circuit includes: a third switching transistor M3.

Specifically, a control electrode of the first switching transistor M1 is connected to the scan signal terminal Scan, a first electrode of the first switching transistor M1 is connected to the data signal terminal Data, and a second electrode of the first switching transistor M1 is connected to a first terminal of the first capacitor C1. A control electrode of the second switching transistor M2 is connected to the first control terminal G1, a first electrode of the second switching transistor M2 is connected to a second terminal of the first capacitor C1, and a second electrode of the second switching transistor M2 is connected to a first electrode of the third switching transistor M3. A control electrode of the third switching transistor M3 is connected to the second control terminal G2, a second electrode of the third switching transistor M3 is connected to a first electrode of the light-emitting element. A control electrode of the driving transistor DTFT is connected to the second terminal of the capacitor C1, a first electrode of the driving transistor DTFT is connected to a first power terminal VDD, a second electrode of the driving transistor DTFT is connected to the first electrode of the third switching transistor M3. A first terminal of the second capacitor C2 is connected to the clock signal terminal CLK, and a second terminal of the second capacitor C2 is connected to the second terminal of the first capacitor C1.

In this embodiment, all the switching transistors M1 to M3 may be N-type thin film transistors or P-type thin film transistors, which can unify the process flow, reduce the number of processes, and help improve the yield of the product. In addition, in view of the fact that the leakage current of low-temperature polysilicon thin film transistors is smaller, all the transistors in the embodiment of the present disclosure are, for example, low-temperature polysilicon thin film transistors, and thin film transistors having a bottom gate structure or thin film transistors having a top gate structure may be specifically selected as the thin film transistors, as long as the switch function can be realized.

It should be noted that the first capacitor C1 and the second capacitor C2 may be liquid crystal capacitors formed by pixel electrodes and a common electrode, or may be equivalent capacitors of storage capacitors and liquid crystal capacitors formed by pixel electrodes and a common electrode, which is not limited in the present disclosure.

The technical solution of the embodiment of the present disclosure will be further described by the operation process of the pixel circuit.

Figure 12:
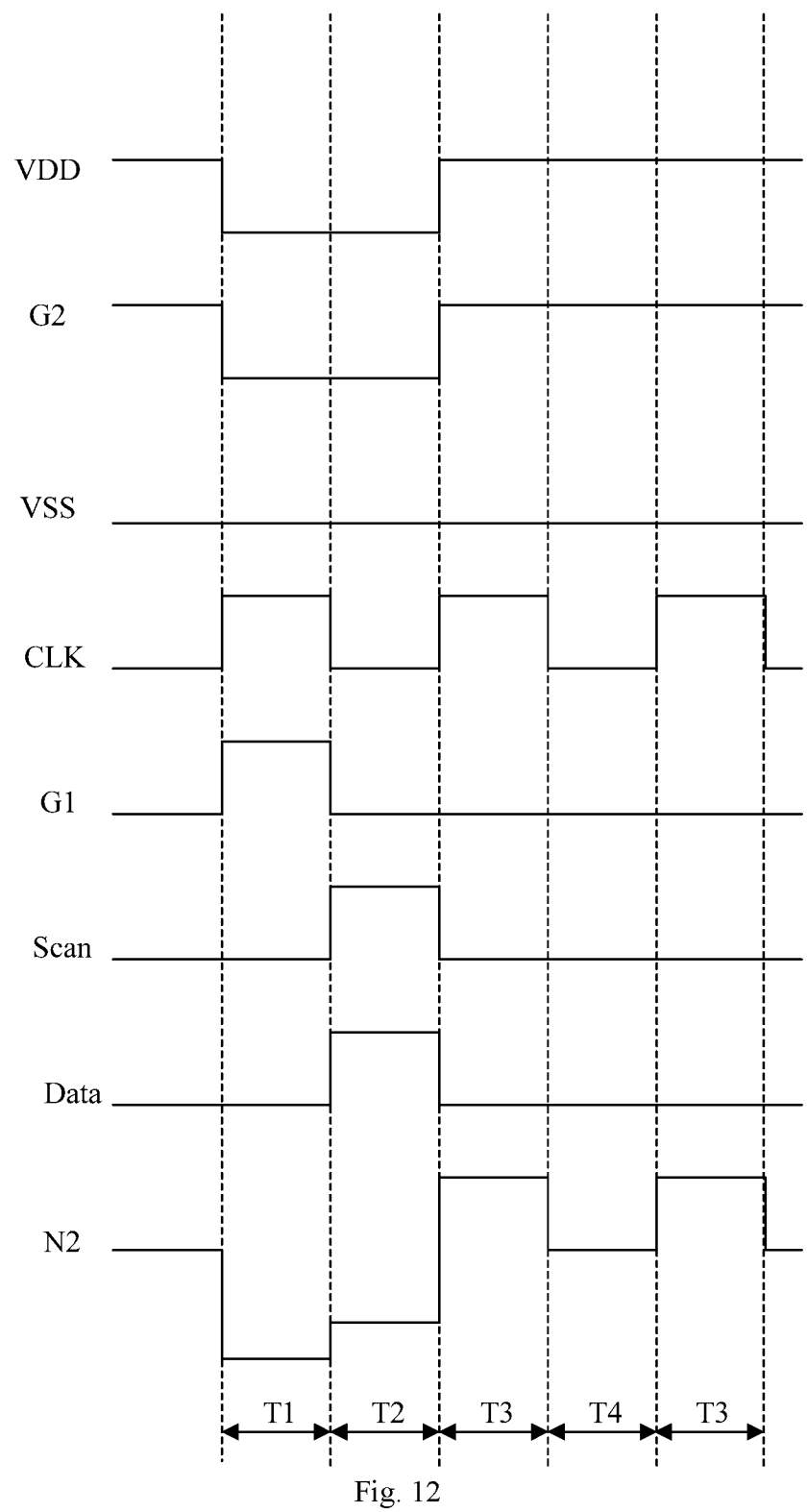
FIG. 12 is a timing chart of operation of a pixel circuit according to an embodiment of the present disclosure.
Figure 13:
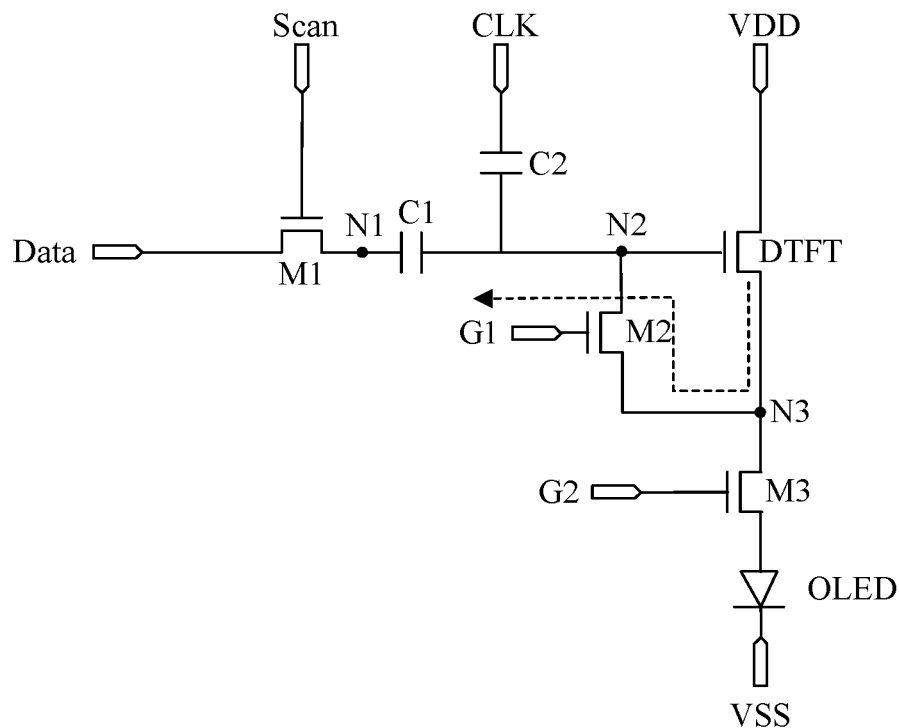
FIG. 13 is a diagram showing the operation state of the pixel circuit in a compensation stage.
Figure 14:
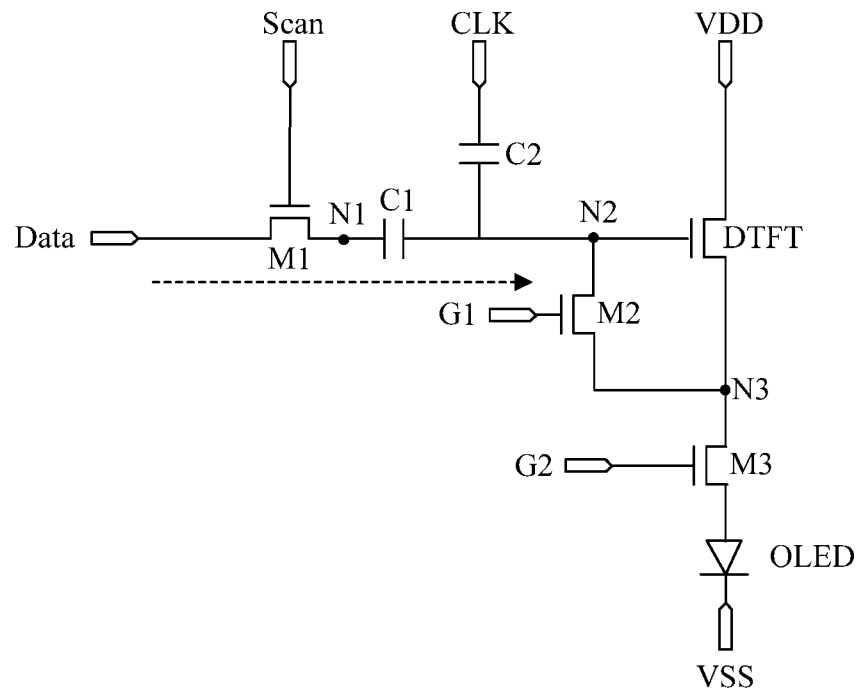
FIG. 14 is a diagram showing the operation state of the pixel circuit in a writing stage.
Figure 15:
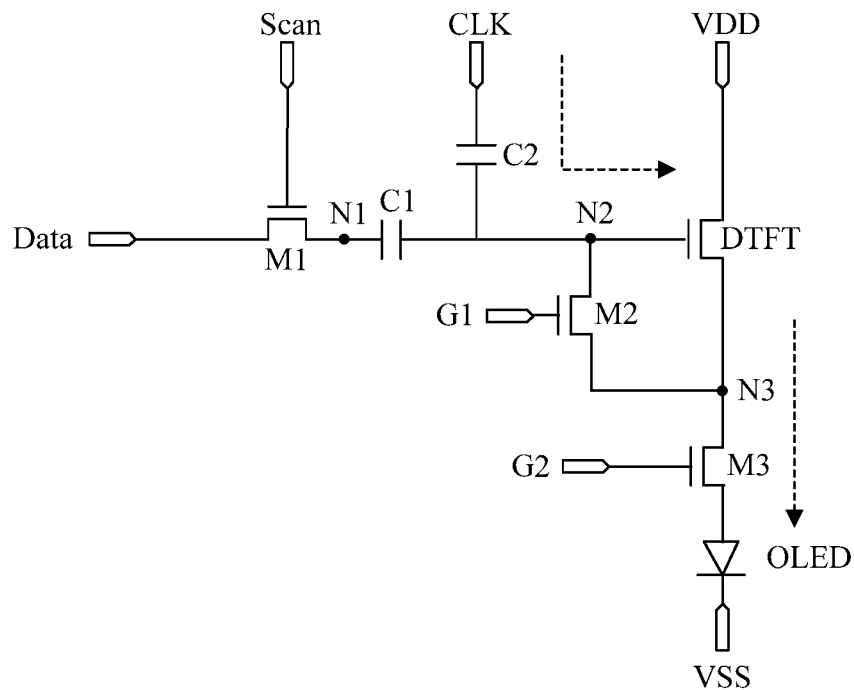
FIG. 15 is operation state diagram 1 of the pixel circuit in a light emitting stage.
Figure 16:
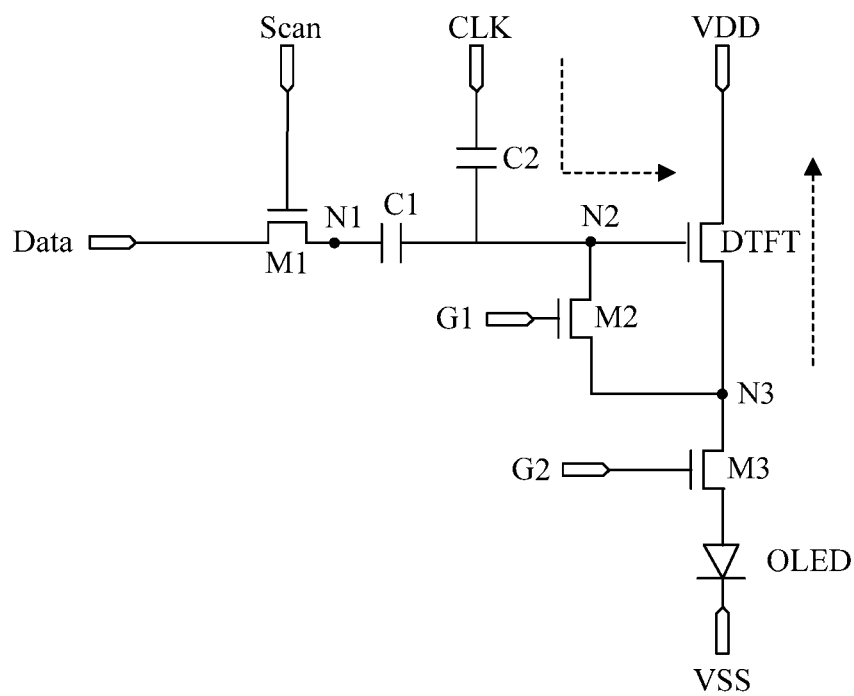
FIG. 16 is operation state diagram 2 of the pixel circuit in the light emitting stage.

Taking all the switching transistors M1~M3 in the pixel circuit provided in the embodiment of the present disclosure are N-type thin film transistors as an example. FIG. 12 is an operation timing chart of the pixel circuit according to the embodiment of the present disclosure; FIG. 13 is an operation state diagram of the pixel circuit in a compensation stage, FIG. 14 is an operation state diagram of the pixel circuit in a writing stage, FIG. 15 is operation state diagram 1 of the pixel circuit in a light emitting stage, and FIG. 16 is operation state diagram 2 of the pixel circuit in the light emitting stage. As shown in FIG. 11 to FIG. 16, the pixel circuit involved in the embodiment of the present disclosure includes: three switching transistors (M1 to M3), one driving transistor (DTFT), two capacitor units (C1 and C2), five signal input terminals (Data, Scan, G1, G2, and CLK) and two power terminals (VDD and VSS).

It should be noted that the first power terminal VDD provides a low level signal having a voltage of a second voltage $V_{d2}$ in the first and second stages, and provides a high level signal having a voltage of a first voltage $V_{d1}$ in the third stage, and $V_{d2}+V_{th}+V_{data}<V_{d1}<V_{d2}+V_{data}+V_c$, wherein $V_{th}$ is the threshold voltage of the driving transistor DTFT, $V_{data}$ is the voltage of the signal of the data signal terminal Data, and $V_c$ is the voltage of the signal of the clock signal terminal CLK when the signal of the clock signal terminal CLK is at a high level. In the embodiments of the present disclosure, $V_{d1}$, $V_{d2}$, or $V_c$ are appropriately set such that $V_{d2}+V_{th}+V_{data}<V_{d1}<V_{d2}+V_{data}+V_c$ is satisfied. The second power terminal VSS steadily provides a low level signal.

Specifically, the first stage T1 is a compensation stage. As shown in FIG. 13, the signal of the second control terminal G2 is at a low level, the third switching transistor M3 is turned off, and the third node N3 is disconnected from the organic light emitting diode OLED. The signal of the first control terminal G1 is at a high level, the second switching transistor M2 is turned on, the signal of the first power terminal VDD is at a low level, the signal of the clock signal terminal CLK is at a high level, and the difference between the voltage of the second node N2 and the second voltage provided by the signal of the first power terminal VDD is greater than the threshold voltage $V_{th}$ of the driving transistor DTFT. At that point, the driving transistor DTFT is turned on, the voltage of the third node N3 is pulled down by the low level signal of the first power terminal VDD. Due to the conduction between the second node N2 and the third node N3, the voltage of the second node N2 is also lowered until the voltage $V_2$ of the second node N2 satisfies $V_2=V_{d2}+V_{th}$. At that point, the driving transistor DTFT is turned off. $V_{d2}$ is the second voltage of the first power terminal VDD, and the first capacitor C1 stores the voltage $V_2$ of the second node N2, $V_2=V_{d2}+V_{th}$.

In this stage, among the input terminals, the signals of the first control terminal G1 and the clock signal terminal CLK are at a high level, the data signal terminal Data, the scan signal terminal Scan and the second control terminal G2 are at a low level, the signals of the first power terminal VDD and the second power terminal VSS are at a low level.

The second stage T2 is a writing stage. As shown in FIG. 14, the signal of the first control terminal G1 is at a low level, the second switching transistor M2 is turned off. The signal of the second control terminal G2 is at a low level, the third switching transistor M3 is turned off, the third node N3 is disconnected from the organic light emitting diode OLED. The signal of the scan signal terminal Scan is at a high level, the first switching transistor M1 is turned on, and the signal of the data signal terminal Data is supplied to the first node N1, the voltage of the first node N1 is $V_1=V_{data}$. The first capacitor C1 generates a bootstrap effect to maintain the voltage difference across the first capacitor C1, and the voltage of the second terminal of the first capacitor C1, that is, the voltage of the second node N2 jumps to $V_2=V_{d2}+V_{th}+V_{data}$. Since the difference between the voltage $V_2$ of the second node N2 and the second voltage $V_{d2}$ provided by the signal of the first power terminal VDD is greater than the threshold voltage $V_{th}$ of the driving transistor DTFT, the driving transistor DTFT is turned on. However, since the third node N3 is disconnected from the organic light emitting diode OLED, the organic light emitting diode OLED does not emit light.

In this stage, among the input terminals, the signals of the scan signal terminal Scan and the data signal terminal Data are at a high level, the signals of the first control terminal G1, the second control terminal G2 and the clock signal terminal CLK are at a low level, the signals of the first power terminal VDD and the second power terminal VSS are at a low level.

The third stage, i.e., a light emitting stage, includes a first sub-stage T3 and a second sub-stage T4.

Specifically, in the first sub-stage T3, as shown in FIG. 15, the signal of the second control terminal G2 is at a high level, the third switching transistor M3 is turned on, the third node N3 is connected to the organic light emitting diode OLED. The signal of the clock signal terminal CLK is at a high level, the second capacitor C2 will have a bootstrap effect to maintain the voltage difference across the second capacitor C2, the voltage of the second terminal of the second capacitor C2, that is, the voltage of the second node N2 jumps to $V_2=V_{d2}+V_{th}+V_{data}+V_c$, where $V_c$ is the voltage of the signal of the clock signal terminal CLK when the signal of the clock signal terminal CLK is at the high level. In this stage, the signal of the first power terminal VDD is at a high level, and the voltage is the first voltage $V_{d1}$, since $V_{d1}$ satisfies $V_{d1}<V_{d2}+V_{data}+V$, the difference between the voltage $V_2$ of the second node N2 and the first voltage $V_{d1}$ of the first power terminal VDD is greater than the threshold voltage $V_{th}$. At that point, the driving transistor DTFT is turned on, the first power terminal VDD outputs a driving current to the third node N3, and the organic light emitting diode OLED emits light.

In this stage, among the input terminals, the signals of the clock signal terminal CLK and the second control terminal G2 are at a high level, the scan signal terminal Scan, the data signal terminal Data and the first control terminal G1 are at a low level, the signal of the first power terminal VDD is at a high level and the signal of the second power terminal VSS is at a low level.

In this stage, the voltage of the second node N2 is $V_2=V_{d2}+V_{th}+V_{data}+V_c$, which is related to the threshold voltage, the voltage of the clock signal terminal and the signal of the data signal terminal in the writing stage. According to the formula of the saturated current of the driving transistor, the driving current $I_{OLED}$ flowing through the organic light emitting diode OLED satisfies:

$$\begin{aligned}I_{OLED} &= K(V_{GS}-V_{th})^2\\&= K(V_2+V_{d1}-V_{th})^2\\&= K(V_{d2}+V_{th}+V_{data}+V_c-V_{d1}-V_{th})^2\\&= K(V_{d2}+V_{data}+V_c-V_{d1})^2\end{aligned}$$

Where K is a fixed constant related to the process parameters and geometric dimensions of the driving transistor DTFT, $V_{GS}$ is the gate-to-source voltage difference of the driving transistor DFTF, and $V_{th}$ is the threshold voltage of the driving transistor DTFT.

It can be seen from the derivation result of the above current formula that, in the first sub-stage, the driving current outputted by the driving transistor DTFT is not affected by the threshold voltage of the driving transistor DTFT, and is only related to the signal of the first power terminal, the signal of the data signal terminal and the high level of the clock signal terminal, thereby eliminating the influence of the threshold voltage of the driving transistor DTFT on the driving current, ensuring uniform display brightness of the display device and improving the display effect of the entire display device.

In the second sub-stage T4, as shown in FIG. 16, the signal of the second control terminal G2 is at a high level, the third switching transistor M3 is turned on, the third node N3 is conductively connected to the organic light emitting diode OLED. The signal of the clock signal terminal CLK is at a low level, and the voltage of the second node N2 is pulled down. At that point, the voltage of the second node N2 is $V_2=V_{d2}+V_{th}+V_{data}$. In this stage, the signal of the first power terminal VDD is at a high level, and the voltage is the first voltage $V_{d1}$, since $V_{d1}$ satisfies $V_{d1}>V_{d2}+V_{th}+V_{data}$, the first voltage $V_{d1}$ of the first power terminal VDD is greater than the voltage of the second node N2. At that point, the driving transistor DTFT is reverse-biased, the first power terminal VDD no longer outputs a driving current to the third node N3, and the organic light emitting diode OLED does not emit light.

In this stage, among the input terminals, the signal of the second control terminal G2 is at a high level, the signals of the first control terminal G1, the clock signal terminal CLK, the data signal terminal Data, and the scan signal terminal Scan are at a low level, the signal of the first power terminal VDD is at a high level, and the signal of the second power terminal VSS is at a low level.

It should be noted that forward biasing refers to a state where a gate-to-source voltage difference of the driving transistor DTFT is greater than the threshold voltage of the driving transistor DTFT, the driving transistor DTFT is turned on and outputs a driving current. Reverse biasing refers to a state where a gate-to-source voltage difference of the driving transistor DTFT is less than 0, and at that time, the driving transistor DTFT is turned off, and a part of electrons trapped when the driving transistor DTFT outputs the driving current is restored.

Specifically, in the first sub-stage T3, the driving transistor DTFT is forward-biased, the organic light-emitting diode OLED normally emits light. In the second sub-stage T4, the driving transistor DTFT is reverse-biased, and the organic light-emitting diode OLED does not emit light, a part of electrons trapped by the driving transistor DTFT during the forward-biasing is restored, thereby electrical parameter drift of the driving transistor is reduced, current efficiency is restored, and the brightness and service time of the organic light emitting diode is improved.

It should be noted that, in the light emitting stage, the first sub-stage T3 and the second sub-stage T4 are continuously repeated as the signal of the clock signal terminal CLK changes until the pixel circuit stops its operation.

In the light emitting stage, as the signal of the clock signal terminal CLK changes, the driving transistor DTFT is forward-biased during half time of the stage and is reverse-biased during the other half. Since the signal of the clock signal terminal CLK changes by microseconds, the human eyes cannot notice flicking.

It should be noted that, in the embodiments of the present disclosure, the switching transistors M1 to M3 are all N-type thin film transistors. The switching transistors M1 to M3 may also be P-type thin film transistors, in this case, the condition for turning on the switching transistors M1 to M3 is a low level input signal.

In the pixel circuit of the embodiment of the present disclosure, with a change of the signal of the clock signal terminal, the driving sub-circuit is forward biased half of the time and reverse-biased during the other half. A part of electrons trapped by the driving transistor during the forward-biasing is restored, thereby electrical parameter drift of the driving transistor is reduced, current efficiency is restored, and the brightness and service time of the organic light emitting diode is improved.

Figure 17:
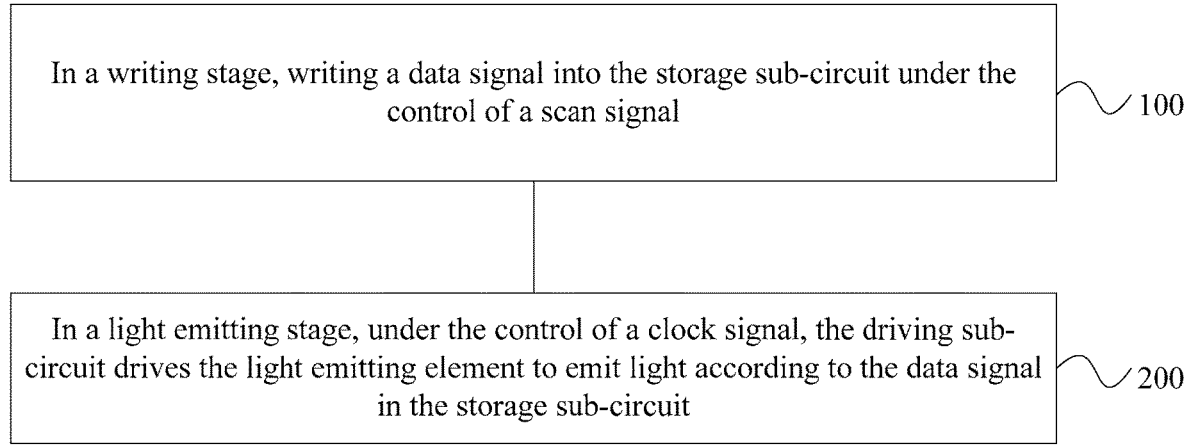
FIG. 17 is a flowchart of a method of driving a pixel circuit according to an embodiment of the present disclosure.

Based on the concept of the above embodiment, an embodiment of the present disclosure further provides a method of driving a pixel circuit, which is applied to the pixel circuit according to the above embodiment of the present disclosure. FIG. 17 is a flowchart of a method of driving a pixel circuit according to an embodiment of the present disclosure. As shown in FIG. 17, the method of driving a pixel circuit provided in this embodiment of the present disclosure specifically includes the following steps.

Step 100: in a writing stage, writing a data signal into the storage sub-circuit under the control of a scan signal.

Specifically, the signal of the scan signal terminal is a pulse signal. In step 100, under the control of the scan signal terminal, the input sub-circuit pulls up the voltage of the first node.

It should be noted that, in the writing stage, the signals of the scan signal terminal Scan and the data signal terminal Data are at a high level, the signals of the first control terminal G1, the second control terminal G2, the clock signal terminal CLK, the first power terminal VDD and the second power terminal VSS are at a low level.

Step 200: in a light-emitting stage, under the control of a clock signal, the driving sub-circuit drives the light-emitting element to emit light according to the data signal in the storage sub-circuit. The voltage of the second node is greater than the sum of a first voltage of the first power terminal and a threshold voltage of the driving transistor, or less than the first voltage of the first power terminal. The driving transistor is controlled to be turned on or off according to the voltage of the second node.

It should be noted that, in the light emitting stage, the signals of the second control terminal G2 and the first power terminal VDD are at a high level, the signals of the scan signal terminal Scan, the data signal terminal Data, the first control terminal G1, and the second power terminal VSS are at a low level, and the signal of the clock signal terminal CLK is a periodic signal.

Specifically, when the signal of the clock signal terminal CLK is at a high level, the voltage of the second node is greater than the sum of the first voltage of the first power terminal VDD and the threshold voltage of the driving transistor. When the signal of the clock signal terminal CLK is at a low level, the voltage of the second node is less than the first voltage of the first power terminal VDD. The driving sub-circuit is controlled according to the signal of the second node.

Specifically, when the voltage of the second node is greater than the sum of the first voltage of the first power terminal and the threshold voltage of the driving transistor, the driving sub-circuit outputs a driving current; when the voltage of the second node is less than the first voltage of the first power terminal, the driving sub-circuit is set in a reverse biased state (turned off).

It should be noted that reverse biasing refers to a state where the gate-to-source voltage difference of the driving transistor DTFT that is less than 0. At that time, the driving transistor DTFT is turned off, and a part of electrons trapped by the driving transistor DTFT when outputting the driving current is restored.

Specifically, in the light emitting stage, the driving transistor DTFT is forward-biased half of the time in which the organic light-emitting diode OLED normally emits light, and is reverse-biased during the other half in which the organic light-emitting diode OLED does not emit light. A part of electrons trapped by the driving transistor DTFT during the forward-biasing is restored, thereby electrical parameter drift of the driving transistor is reduced, current efficiency is restored, and the brightness and service time of the organic light emitting diode is improved.

The method of driving a pixel circuit provided in an embodiment of the present disclosure includes: in a writing stage, writing a data signal to the storage sub-circuit under the control of a scan signal; in a light-emitting stage, under the control of a clock signal, the driving sub-circuit drives the light-emitting element to emit light according to the data signal in the storage sub-circuit. Wherein, under the control of the clock signal, the voltage of the second node is greater than the sum of a first voltage of the first power terminal and a threshold voltage of the driving transistor, or less than the first voltage of the first power terminal. The driving transistor is controlled to be turned on or off according to the voltage of the second node. In the technical solution provided by this embodiment of the present disclosure, through controlling the voltage of the second node by the signal of the clock signal terminal, electrical parameter drift in the driving transistor can be reduced, the current efficiency can be restored, and the brightness and service life of the organic light-emitting diode can be improved.

Figure 18:
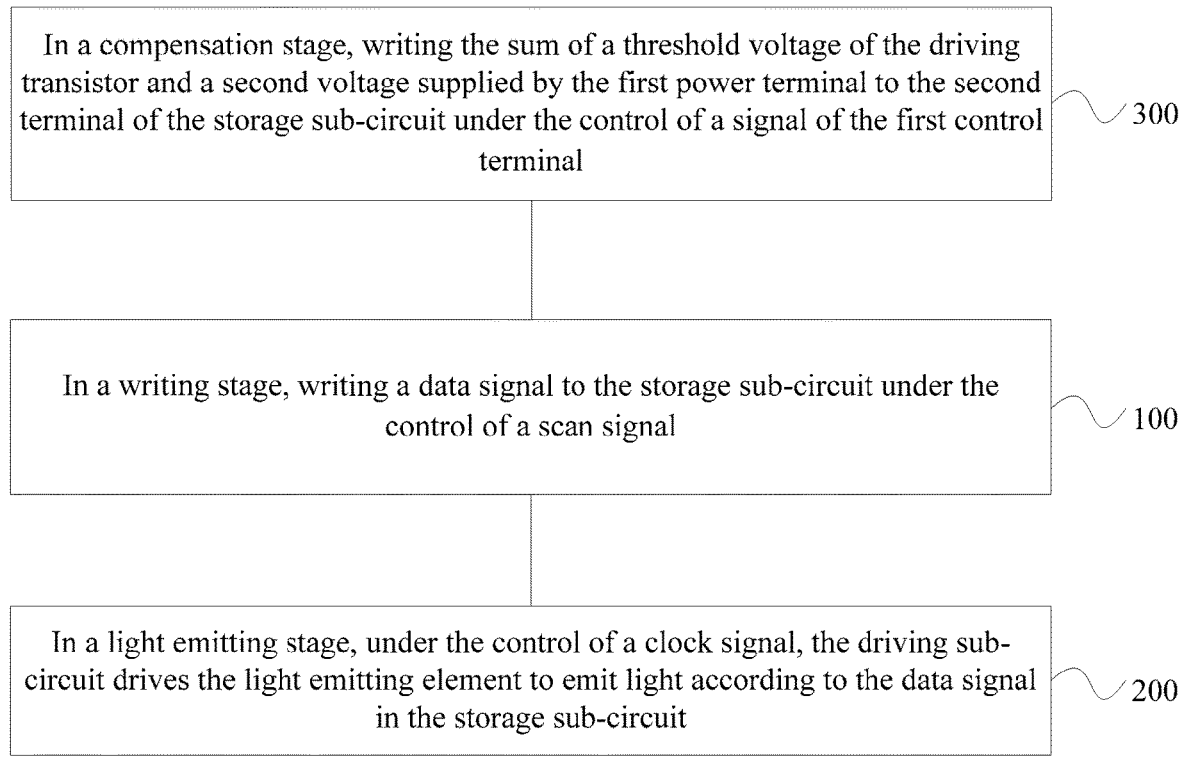
FIG. 18 is another flowchart of a method of driving a pixel circuit according to an embodiment of the present disclosure.

Optionally, FIG. 18 is another flowchart of a method of driving a pixel circuit according to an embodiment of the present disclosure. As shown in FIG. 18, the method of driving a pixel circuit provided in the embodiment of the present disclosure further includes step 300: in a compensation stage, writing the sum of a threshold voltage of the driving transistor and a second voltage supplied by the first power terminal to the second terminal of the storage sub-circuit under the control of a signal of the first control terminal.

It should be noted that, in the compensation stage, the signals of the first control terminal and the clock signal terminal are at a high level, and the second control terminal, the scan signal terminal, the data signal terminal, the first power terminal, and the second power terminal are all at a low level.

Optionally, the method of driving a pixel circuit provided in this embodiment of the present disclosure may further include: in the light emitting stage, conductively connecting the second electrode of the driving transistor to the first electrode of the light emitting device under the control of a signal of the second control terminal.

In the light emitting stage, as the signal of the clock signal terminal CLK changes, the driving transistor DTFT is forward-biased half of the time and is reverse-biased during the other half. Since the signal of the clock signal terminal CLK changes by microseconds, the human eyes cannot notice the flicking.

In the method of driving a pixel circuit provided in the embodiment of the present disclosure, with a change of the signal of the clock signal terminal, the driving sub-circuit is forward-biased half of the time of the light emitting stage, and reverse-biased during the other half. A part of electrons trapped by the driving transistor during the forward-biasing is restored, thereby electrical parameter drift of the driving transistor is reduced, current efficiency is restored, and the brightness and service time of the organic light emitting diode is improved.

Based on the concept of the above embodiments, an embodiment of the present disclosure further provides a display device including a pixel circuit.

The pixel circuit is a pixel circuit according to the above embodiments of the present disclosure, with the similar implementation principle and implementation effect, which will not be repeated herein.

The display device may include a display substrate, and the pixel circuit may be disposed on the display substrate. Optionally, the display device may be an OLED panel, a mobile phone, a tablet computer, a TV, a display, a notebook computer, a digital frame, a navigator or any other product or component having display function.

The display substrate of the display device provided in the embodiment of the present disclosure may optionally employ a low temperature poly-silicon (LTPS) process. This design of a plurality of transistors and a plurality of capacitors does not affect the aperture ratio of the module.

It should be noted that the display substrate of the display device provided in the embodiment of the present disclosure may also employ an amorphous silicon process. It should be noted that the pixel circuit provided in the embodiment of the present disclosure may employ thin film transistors of amorphous silicon process, polysilicon process, oxide semiconductor process, or the like.

The type of thin film transistors used in the pixel circuit of the embodiment of the present disclosure can be replaced according to actual needs. Moreover, although the above description has been made by taking an active matrix organic light emitting diode as an example, the present disclosure is not limited to a display substrate using an active matrix organic light emitting diode, and can also be applied to a display substrate using other various light emitting diodes.

Several points should be noted as follows.

The drawings of the embodiments of the present disclosure only relate to those structures mentioned in the embodiments of the present disclosure. For other structures, reference can be made to common designs thereof.

Without conflicts, the embodiments and the features of the embodiments of the present disclosure may be combined with each other to obtain new embodiments.

While the embodiments of the present invention have been described above, the described embodiments are merely for the purpose of understanding the present disclosure and are not intended to limit the present disclosure. Any modification and variation in the form and details of the embodiments may be made by those skilled in the art without departing from the spirit and scope of the present disclosure. However, the spirit and scope of the present disclosure is to be determined by the following claims.

What is claimed is:

1. A pixel circuit, including:
a light-emitting element configured to emit light;
an input sub-circuit configured to receive a data signal under control of a scan signal;
a storage sub-circuit configured to store the data signal;
a node control sub-circuit configured to receive a clock signal; and
a driving sub-circuit configured to drive the light-emitting element to emit light based on the clock signal from the node control sub-circuit and the data signal stored in the storage sub-circuit,
wherein the input sub-circuit is connected to a data signal terminal for providing the data signal, a scan signal terminal for providing the scan signal, and a first node,
the storage sub-circuit is connected to the first node and a second node,
the node control sub-circuit is connected to a clock signal terminal for providing the clock signal and the second node,
the driving sub-circuit is connected to the second node, a third node, and a first power terminal for providing a first voltage and a second voltage,
a first electrode of the light-emitting element is connected to the third node, and a second electrode of the light-emitting element is connected to a second power terminal, and
the node control sub-circuit is further configured to control a voltage of the second node according to the clock signal of the clock signal terminal such that
in a first sub-stage of a light-emitting stage, the voltage of the second node is greater than a sum of the first voltage of the first power terminal and a threshold voltage of the driving transistor, and
in a second sub-stage of the light-emitting stage, the voltage of the second node less than the first voltage of the first power terminal.

2. The pixel circuit according to claim 1, further including:
a compensation sub-circuit,
wherein the compensation sub-circuit is connected to a first control terminal for controlling the compensation sub-circuit, the second node and the third node, and is configured to provide a voltage of the third node to the second node under the control of the first control terminal.

3. The pixel circuit according to claim 2, wherein the compensation sub-circuit includes: a second switching transistor,
a control electrode of the second switching transistor is connected to the first control terminal, a first electrode of the second switching transistor is connected to the second node, and a second electrode of the second switching transistor is connected to the third node.

4. The pixel circuit according to claim 1, further including:
a switch control sub-circuit,
wherein the switch control sub-circuit is connected to a second control terminal for controlling the switch control sub-circuit, the third node and a light emitting element, and is configured to control conduction between the third node and the first electrode of the light-emitting element under the control of the second control terminal.

5. The pixel circuit according to claim 4, wherein the switch control sub-circuit includes: a third switching transistor,
a control electrode of the third switching transistor is connected to the second control terminal, a first electrode of the third switching transistor is connected to the third node, and a second electrode of the third switching transistor is connected to the first electrode of the light-emitting element.

6. The pixel circuit according to claim 1, wherein the input sub-circuit includes: a first switching transistor,
a control electrode of the first switching transistor is connected to the scan signal terminal, a first electrode of the first switching transistor is connected to the data signal terminal, and a second electrode of the first switching transistor is connected to the first node.

7. The pixel circuit according to claim 1, wherein the storage sub-circuit includes: a first capacitor,
a first terminal of the first capacitor is connected to the first node, and a second terminal of the first capacitor is connected to the second node.

8. The pixel circuit according to claim 1, wherein the node control sub-circuit includes: a second capacitor,
a first terminal of the second capacitor is connected to the clock signal terminal, and a second terminal of the second capacitor is connected to the second node.

9. The pixel circuit according to claim 1, wherein the driving sub-circuit includes: a driving transistor,
a control electrode of the driving transistor is connected to the second node, a first electrode of the driving transistor is connected to the first power terminal, and a second electrode of the driving transistor is connected to the third node.

10. The pixel circuit according to claim 1, further including a compensation sub-circuit and a switch control sub-circuit, wherein the input sub-circuit includes a first switching transistor, the storage sub-circuit includes a first capacitor, the driving sub-circuit includes a driving transistor, the node control sub-circuit includes a second capacitor, the compensation sub-circuit includes a second switching transistor, the switch control sub-circuit includes a third switching transistor,
a control electrode of the first switching transistor is connected to the scan signal terminal, a first electrode of the first switching transistor is connected to the data signal terminal, and a second electrode of the first switching transistor is connected to a first terminal of the first capacitor,
a control electrode of the second switching transistor is connected to a first control terminal, a first electrode of the second switching transistor is connected to a second terminal of the first capacitor, and a second electrode of the second switching transistor is connected to a first electrode of the third switching transistor,
a control electrode of the third switching transistor is connected to a second control terminal, a second electrode of the third switching transistor is connected to a first electrode of the light-emitting element,
a control electrode of the driving transistor is connected to the second terminal of the first capacitor, a first electrode of the driving transistor is connected to a first power terminal, and a second electrode of the driving transistor is connected to the first electrode of the third switching transistor, and
a first terminal of the second capacitor is connected to the clock signal terminal, and a second terminal of the second capacitor is connected to the second terminal of the first capacitor.

11. A display device, including the pixel circuit according to claim 1.

12. A method of driving the pixel circuit according to claim 1, including:
in a writing stage, writing the data signal to the storage sub-circuit under the control of the scan signal;
in the light-emitting stage, under the control of the clock signal, driving, by the driving sub-circuit, the light-emitting element to emit light according to the data signal in the storage sub-circuit.

13. The method according to claim 12, wherein
the driving sub-circuit includes a driving transistor, and in a first sub-stage of a light emitting stage, under the control of the clock signal, the voltage of the second node is greater than a sum of a first voltage of the first power terminal and a threshold voltage of the driving transistor, in a second sub-stage of the light emitting stage, the voltage of the second node is less than the first voltage of the first power terminal, and the driving transistor is controlled to be turned on or off according to the voltage of the second node.

14. The method according to claim 13, wherein when the signal of the clock signal terminal is at a high level, the voltage of the second node is greater than the sum of the first voltage of the first power terminal and the threshold voltage of the driving transistor; and when the signal of the clock signal terminal is at a low level, the voltage of the second node is less than the first voltage of the first power terminal,
the driving transistor being controlled to be turned on or off according to the voltage of the second node includes:
when the voltage of the second node is greater than the sum of the first voltage of the first power terminal and the threshold voltage of the driving sub-circuit, the driving transistor outputs a driving current; and when the voltage of the second node is less than the first voltage of the first power terminal, the driving transistor is set in a reverse biased state.

15. The method according to claim 13, further including in a compensation stage, under the control of a signal of a first control terminal, writing the sum of the threshold voltage of the driving transistor and a second voltage supplied by the first power terminal to a second terminal of the storage sub-circuit.

16. The method according to claim 13, further including in the light emitting stage, under the control of a signal of the second control terminal, conductively connecting a second electrode of the driving transistor to the first electrode of the light emitting element.

* * * * *